United States Patent
Jeng

(10) Patent No.: US 6,391,718 B1
(45) Date of Patent: May 21, 2002

(54) PLANARIZATION METHOD FOR FLASH MEMORY DEVICE

(75) Inventor: Pei-Ren Jeng, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 09/788,705

(22) Filed: Feb. 20, 2001

(30) Foreign Application Priority Data

Jan. 3, 2001 (TW) .......................................... 90100096

(51) Int. Cl.⁷ ............................................ H01L 21/336
(52) U.S. Cl. ...................... 438/258; 438/275; 438/279; 438/697; 438/760
(58) Field of Search ............................... 438/257, 258, 438/260, 261, 263, 266, 267, 275, 279, 697, 760

(56) References Cited

U.S. PATENT DOCUMENTS 6,004,843 A * 12/1999 Huang ........................ 438/258
2001/0012226 A1 * 8/2001 Jeng et al. ................... 438/260

* cited by examiner

Primary Examiner—Chandra Chaudhari
Assistant Examiner—Jack Chen
(74) Attorney, Agent, or Firm—J. C. Patents

(57) ABSTRACT

A method to planarize a flash memory device, wherein the method is applied on a substrate having a polysilicon layer and a cap layer sequentially formed thereon. Thereafter, the cap layer and the polysilicon layer are patterned to form the peripheral circuit region and the memory cell region. A dielectric layer is then formed on the substrate, covering the cap layer. A portion of the dielectric layer is further removed to expose a part of the cap layer, such that the dielectric layer above the cap layer and the dielectric layer on both sides of the cap layer become separated. A portion of the dielectric layer in the peripheral circuit region is then removed, followed by forming a photoresist layer on the substrate such that a portion of the dielectric layer in the peripheral circuit region and in the memory cell region is exposed. The dielectric layer exposed by the photoresist layer is then removed, followed by removing the photoresist layer. The cap layer is subsequently removed to complete the planazation of the flash memory device.

20 Claims, 2 Drawing Sheets

PLANARIZATION METHOD FOR FLASH MEMORY DEVICE

CROSS-REFERENCE TO RELATED APPLICATION

This application claims the priority benefit of Taiwan application serial no. 90100096, filed Jan. 3, 2001.

BACKGROUND OF THE INVENTION

1. Field of Invention

This invention relates to a planarization method. More particularly, the present invention relates to a planarization method for flash memory devices.

2. Description of Related Art

Flash memory device is an electrically-erasable-programmable-read-only memory device, which has the advantages of being programmable, erasable and the ability of retaining data after the power is off. A flash memory device is thus commonly used in personal computer and electronic devices. Flash memory device is also a non-volatile memory (NVM), which has the advantages of being small in dimension, speedy data retrieval and storage, and low power consumption. Furthermore, the erasing of data in a flash memory device uses the "block-by-block" method; therefore, it also has the advantage of having faster operational speed.

The basic structure of the memory cell region of a flash memory device includes a stacked gate structure, wherein the stacked gate structure comprises a tunnel oxide layer, a floating gate, a dielectric layer, a control gate and source/drain regions in the substrate on both sides of the stacked gate structure. In addition, at the peripheral of the memory cell region is the periphery circuit region, which includes peripheral devices that are used to write, to erase or to read data in the memory cell region.

The conventional fabrication method of a flash memory device includes depositing a dielectric layer on the substrate to cover the memory cell region and the peripheral circuit region after forming the memory cell region and the peripheral circuit region at the peripheral of the memory cell region. Chemical-mechanical polishing (CMP) is then conducted to form a planarized surface.

Using the conventional CMP process to planarize a flash memory device has several disadvantages. First of all, chemical-mechanical polishing a larger area is easier to control, for example, the area of the peripheral circuit region. However, chemical-mechanical polishing a smaller area, for example, the area of the memory cell region, is difficult to control. Hence, using chemical-mechanical polishing for planarization, it is difficult to control the polishing end point for the entire device. In addition, microscratches are easily induced on the device. Moreover, using chemical mechanical polishing to planarize an area with uneven surface levels, for example, the shallow trench isolation region, would easily have the polished debris remaining in the area.

SUMMARY OF THE INVENTION

The invention provides a method to planarize a flash memory device. The method does not require the application of chemical-mechanical polishing to accomplish the planarization of the flash memory device. The various disadvantages of chemical-mechanical polishing are thus prevented.

The present invention provides a planarization method for a flash memory device, wherein this method includes forming sequentially a polysilicon layer and a cap layer on a substrate. Thereafter, the cap layer and the polysilicon layer are patterned to form the peripheral circuit region and the memory cell region. A dielectric layer is then formed on the substrate, covering the cap layer. A portion of the dielectric layer is then removed to expose a part of the cap layer, such that the dielectric layer above the cap layer and the dielectric layer on both sides of the cap layer becomes separated. A portion of the dielectric layer in the peripheral circuit region is further removed, followed by forming a photoresist layer on the substrate, wherein a portion of the dielectric layer in the peripheral circuit region and in the memory cell region is exposed. The dielectric layer exposed by the photoresist layer is then removed, followed by removing the photoresist layer. The cap layer is subsequently removed to complete the planazation of the flash memory device.

According to the present invention, the planarization of a flash memory device is accomplished by etching. The common problems encountered in chemical-mechanical polishing, such as controlling the polishing end point, forming microscratches on the device surface and having polished debris remaining in areas with uneven surface levels, are prevented.

The present invention employs a photoresist layer, which only exposes a portion of the dielectric layer in the peripheral circuit region and in the memory cell region. Moreover, the dielectric layer in the peripheral circuit region and in the memory cell region is removed first, followed by removing the cap layer. As a result, the problems of having the dielectric layer detached and suspended in solvent during the removal of the cap layer, and having debris adhered to the wafer, which would lead to the formation of defects in the subsequent processes, are prevented.

According to the present invention, the dielectric layer in the peripheral circuit region and in the memory cell region is removed first, followed by removing the cap layer. The potential problem of contaminating the cleaning machine when the wafer is being cleaned, due to the suspension of the dielectric layer in the solvent when the cap layer is removed, is thus prevented.

The present invention employs a photoresist layer, which only exposes a portion of the dielectric layer in the peripheral circuit region and in the memory cell region. The dielectric layer in the peripheral circuit region and in the memory cell region is removed first, followed by removing the cap layer. The problem of having small pieces of the detached dielectric layer 106a suspending in solvent and adhering to the wafer and leading to defects in the subsequent processes is prevented.

According to the present invention, the dielectric layer in the peripheral circuit region and in the memory cell region is removed first, followed by removing the cap layer. The potential problem of contaminating the cleaning machine during the subsequent cleaning of the wafer due to the small pieces of the dielectric layer suspending in the solvent when the cap layer is removed is thus prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 1A through 1F are schematic, cross-sectional views, illustrating sucessive steps of the method for planarizing a flash memory device according to one preferred embodiment of this invention.

Figure 1A:
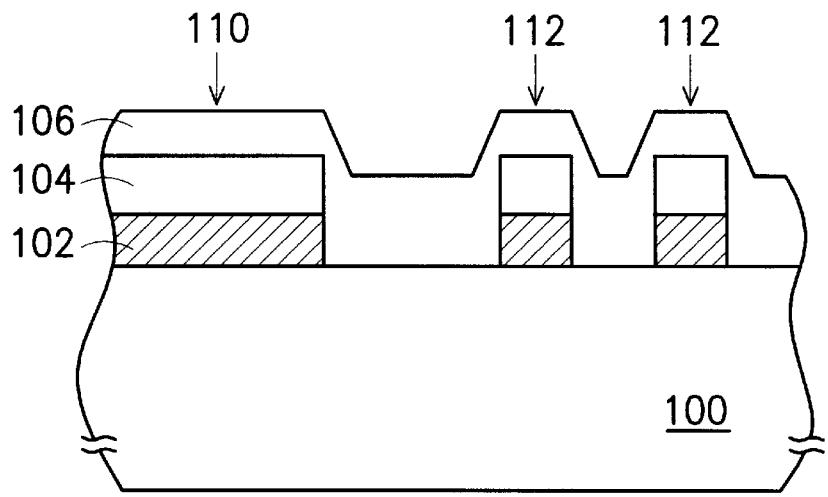
FIGS. 1A through 1F are schematic, cross-sectional views, illustrating the successive steps of the method for planarizing a flash memory device according to one preferred embodiment of this invention.

Referring to FIG. 1A, a substrate 100 is provided. A polysilicon layer 102 is formed on the substrate 100, followed by forming a cap layer 104 on the polysilicon layer 102. The material used for the cap layer 104 includes silicon nitride. Photolithography and etching are then performed to pattern the cap layer 104 and the polysilicon layer 102 to form a peripheral circuit region 110 and a memory cell region 112. After this, a dielectric layer 106 is formed on the substrate 100, covering the cap layer 104. The dielectric layer 106, such as a silicon dioxide layer, is formed by, for example, high-density plasma chemical vapor deposition (HDP-CVD).

Figure 1B:
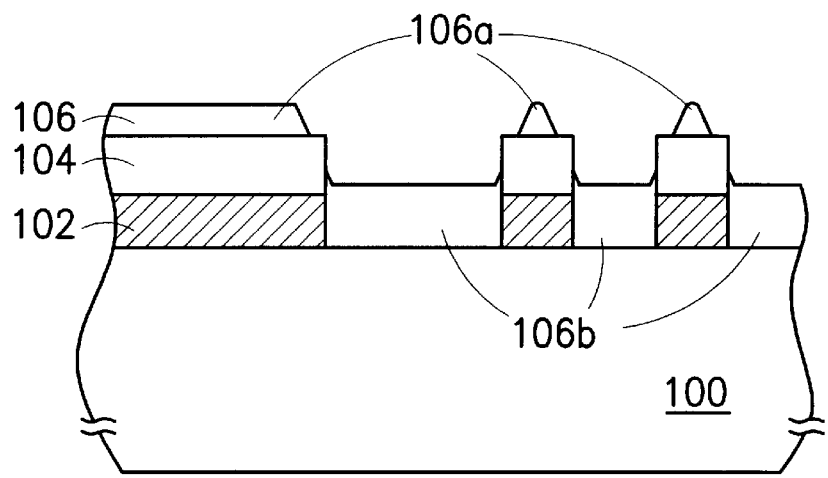

Continuing to FIG. 1B, a portion of the dielectric layer 106 is removed to expose a part of the cap layer 104. To remove the portion of the dielectric layer 106 includes wet etching the dielectric layer 106 such that the dielectric layer 106a above the cap layer 104 and the dielectric layer 106b on both sides of the cap layer 104 becomes separated.

Figure 1C:
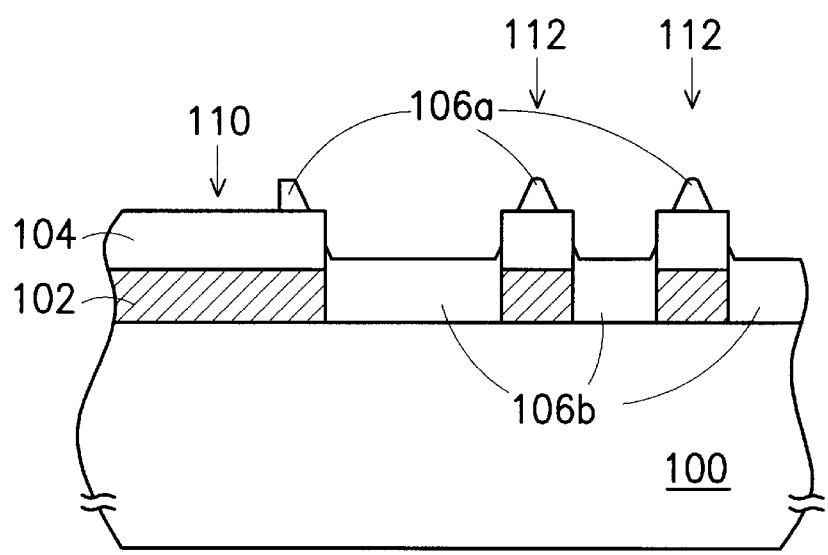

Thereafter, as shown in FIG. 1C, a portion of the dielectric layer 106a in the peripheral circuit region 110 is removed to expose a part of the cap layer 104 in the peripheral circuit region 110. The dielectric layer 106a in the memory cell region 112 and a portion of the dielectric layer 106a in the peripheral circuit region 110 are retained. The portion of the dielectric layer 106a in the peripheral circuit region 110 is removed by, for example, photolithography and etching.

Figure 1D:
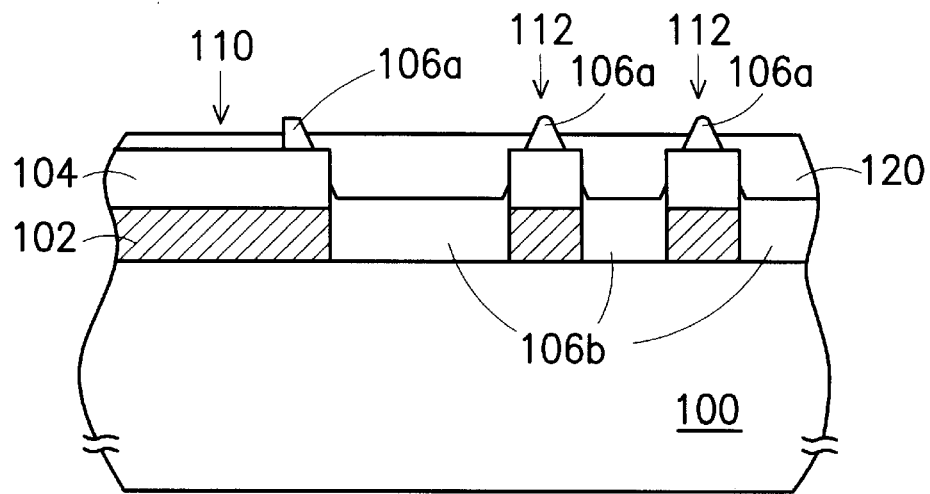

Referring to FIG. 1D, a photoresist layer 120 is formed on the substrate 100, covering the cap layer 104 and the dielectric layer 106b, and exposing a portion of the dielectric layer 106a in the peripheral circuit region 110 and in the memory cell region 112. The photoresist layer 120 is, for example, about 1500 angstroms to 2000 angstroms thick.

Figure 1E:
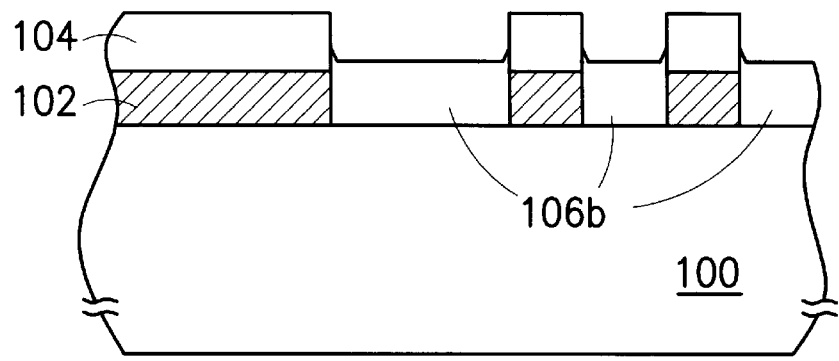

Continuing to FIG. 1E, the dielectric layer 106a exposed by the photoresist layer 120 is removed, for example, by dry etching. Removing the dielectric layer 106a exposed by the photoresist layer 120 is accomplished by having a high etching selectivity ratio between the dielectric layer 106a and the photoresist layer 120, for example, the etching selectivity ratio between the dielectric layer 106a and the photoresist layer 120 is 5:1. Subsequently, the photoresist layer 120 is removed.

According to the present invention, the photoresist layer 120 covers the dielectric layer 106b and the cap layer 104, and partially exposes the dielectric layer 106a. Furthermore, the dielectric layer 106a above the cap layer 104 is removed first. As a result, the problems of having the dielectric layer 106a debris suspended in the etchant during the subsequent removal of the cap layer 104, leading to defects in the subsequent processes and contamination of the cleaning machine are prevented.

Figure 1F:
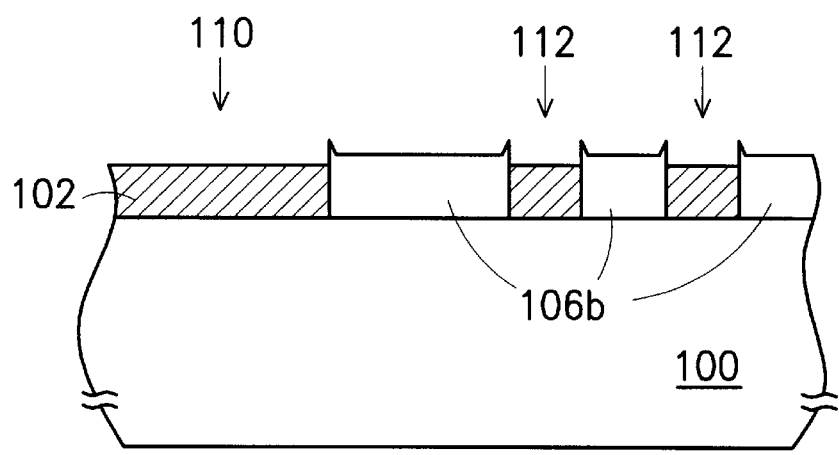

Referring to FIG. 1F, the cap layer 104 is removed to form a planarized surface among the peripheral circuit region 110, the memory cell region 112 and dielectric layer 106b. The purpose of planarizing the flash memory device is thus accomplished. The cap layer 104 is removed, for example, by using hot phosphoric acid.

According to the present invention, the planarization of a flash memory device is accomplished by etching. The common problems encountered in chemical-mechanical polishing, such as controlling of the polishing end point, forming microscratches on the polished surface and leaving the dielectric layer 104 debris in areas with uneven surface levels, are prevented.

The present invention employs the photoresist layer 120, which only exposes a portion of the dielectric layer 106a in the peripheral circuit region 110 and in the memory cell region 112. Moreover, the exposed dielectric layer 106a in the peripheral circuit region 110 and in the memory cell region 112 is removed first, followed by removing the cap layer 104. As a result, the problems of having the dielectric layer 106a detached from the cap layer 104 and suspended in the etchant during the removal of the cap layer 104, and rendering debris adhered to the wafer and leading to defects in the subsequent processes, are prevented.

According to the present invention, the dielectric layer 106a in the peripheral circuit region 110 and in the memory cell region 112 is removed first, followed by removing the cap layer 104. The potential problem of contaminating the cleaning machine when the wafer is being cleaned, due to the suspension of the dielectric layer 106a in the etchant when the cap layer 104 is removed, is thus prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A planarization method for a flash memory device, comprising:

providing a substrate;

forming a polysilicon layer on the substrate;

forming a cap layer on the polysilicon layer;

patterning the cap layer and the polysilicon layer to form a peripheral circuit region and a plurality of memory cell regions;

forming a dielectric layer on the substrate to cover the cap layer;

removing a portion of the dielectric layer to expose a part of the cap layer such that the dielectric layer above the cap layer and the dielectric layer on both sides of the cap layer become separated;

removing a portion of the dielectric layer in the peripheral circuit region;

forming a photoresist layer on the substrate to expose a portion of the dielectric layer in the peripheral circuit region and in the memory cell regions, removing the dielectric layer exposed by the photoresist layer;

removing the photoresist layer; and removing the cap layer.

2. The method of claim 1, wherein removing the dielectric layer exposed by the photoresist layer includes dry etching.

3. The method of claim 1, wherein the photoresist layer is about 1500 angstroms to 2000 angstroms thick.

4. The method of claim 1, wherein an etching selectivity ratio between the dielectric layer and the photoresist layer is about 5:1.

5. The method of claim 1, wherein forming the dielectric layer includes performing high density plasma chemical vapor deposition.

6. The method of claim 1, wherein the dielectric layer includes silicon dioxide.

7. The method of claim 1, wherein removing the portion of the dielectric layer to expose the part of the cap layer includes wet etching.

8. The method of claim 1, wherein removing the cap layer includes using hot phosphoric acid.

9. The method of claim 1, wherein the cap layer includes silicon nitride.

10. The method of claim 1, wherein an etching selectivity ratio between the cap layer and the dielectric layer is high.

11. A planarizing method, comprising:

providing a substrate;

forming a first device and a second device on the substrate, wherein the first device and the second device comprise a cap layer on a top, wherein an area of the first device is bigger than an area of the second device;

forming a dielectric layer on the substrate, wherein the dielectric layer also covers the cap layer;

removing a portion of the dielectric layer to expose a part of the cap layer such that the dielectric layer above the cap layer and the dielectric layer on both sides of the cap layer become separated;

removing a portion of the dielectric layer in the first device;

forming a photoresist layer on the substrate to expose a portion of the dielectric layer in the first device and the second device;

removing the dielectric layer exposed by the photoresist layer;

removing the photoresist layer; and removing the cap layer.

12. The method of claim 11, wherein removing the dielectric layer exposed by the photoresist layer includes dry etching.

13. The method of claim 11, wherein the photoresist layer is about 1500 angstroms to about 2000 angstroms thick.

14. The method of claim 11, wherein an etching selectivity ratio between the dielectric layer and the photoresist layer is about 5:1.

15. The method of claim 11, wherein forming the dielectric layer includes using high density plasma chemical vapor deposition.

16. The method of claim 11, wherein the dielectric layer includes silicon dioxide.

17. The method of claim 11, wherein removing the portion of the dielectric layer to expose the part of the cap layer includes wet etching.

18. The method of claim 11, wherein removing the cap layer includes using hot phosphoric acid.

19. The method of claim 11, wherein the cap layer includes silicon nitride.

20. The method of claim 11, wherein the cap layer and the dielectric layer comprise a high etching selectivity ratio.

* * * * *